US008350835B2

(12) United States Patent
Katoh et al.

(10) Patent No.: US 8,350,835 B2
(45) Date of Patent: Jan. 8, 2013

(54) DISPLAY DEVICE

(75) Inventors: Hiromi Katoh, Osaka (JP); Christopher Brown, Oxford, MI (US)

(73) Assignee: Sharp Kabushiki Kaisha, Osaka (JP)

( * ) Notice: Subject to any disclaimer, the term of this patent is extended or adjusted under 35 U.S.C. 154(b) by 400 days.

(21) Appl. No.: 12/674,359

(22) PCT Filed: Aug. 13, 2008

(86) PCT No.: PCT/JP2008/064526
§ 371 (c)(1),
(2), (4) Date: Feb. 19, 2010

(87) PCT Pub. No.: WO2009/025223
PCT Pub. Date: Feb. 26, 2009

(65) Prior Publication Data
US 2011/0175871 A1    Jul. 21, 2011

(30) Foreign Application Priority Data

Aug. 21, 2007 (JP) .................................. 2007-215018

(51) Int. Cl.
*G09G 5/00* (2006.01)
(52) U.S. Cl. ............. 345/207; 345/81; 345/84; 345/92; 345/204; 345/214; 349/49; 349/19; 348/207.99; 348/362
(58) Field of Classification Search .................. 345/166, 345/81, 87–92, 104, 204–207, 212, 214; 250/200, 553; 349/49, 19, 33, 41, 50; 348/207.99, 348/362
See application file for complete search history.

(56) References Cited

U.S. PATENT DOCUMENTS

| 3,560,809 A * | 2/1971 | Terakado ...................... 257/480 |
| 4,945,418 A | 7/1990 | Mutoh |
| 5,841,180 A | 11/1998 | Kobayashi et al. |
| 6,512,544 B1 | 1/2003 | Merrill et al. |
| 2003/0011694 A1* | 1/2003 | Dierickx ........................ 348/308 |
| 2004/0196398 A1* | 10/2004 | Doering et al. ............... 348/308 |
| 2005/0045881 A1 | 3/2005 | Nakamura et al. |

(Continued)

FOREIGN PATENT DOCUMENTS

| JP | 05-276442 | 10/1993 |
| JP | 2007-018458 | 1/2007 |
| JP | 2007-114315 | 5/2007 |

OTHER PUBLICATIONS

Behzad Razavi, Desing of Analog CMOS Integrated Circuits, Tata McGraw-Hill Edition, pp. 619-621.*

(Continued)

*Primary Examiner* — Lun-Yi Lao
*Assistant Examiner* — Md Saiful A Siddiqui
(74) *Attorney, Agent, or Firm* — Nixon & Vanderhye P.C.

(57) ABSTRACT

Dynamic range is widened in a display device with a photosensor that can read an image due to having a photodetection element inside a pixel thereof. A sensor driving circuit switches ON a reset signal (RST) that is supplied via reset signal bus line, and after a predetermined time has elapsed, switches ON a readout signal (RWS) that is supplied via readout signal bus line. Thus, in the photosensor, from which a photosensor signal is output in accordance with an amount of light received by the photosensor in the predetermined time, the capacitance of a capacitor provided in the photosensor is made variable from when the reset signal (RST) is supplied to the photosensor until when the predetermined time has elapsed.

13 Claims, 14 Drawing Sheets

U.S. PATENT DOCUMENTS

| | | |
|---|---|---|
| 2005/0212916 A1 | 9/2005 | Nakamura et al. |
| 2005/0258337 A1 | 11/2005 | Ozawa |
| 2005/0280713 A1* | 12/2005 | Hagihara et al. ......... 348/207.99 |
| 2006/0124828 A1 | 6/2006 | Shin |
| 2006/0231875 A1 | 10/2006 | Patrick et al. |
| 2008/0018612 A1* | 1/2008 | Nakamura et al. ............ 345/173 |
| 2009/0050891 A1 | 2/2009 | Katoh |

OTHER PUBLICATIONS

International Search Report for PCT/JP2008/064526, mailed Nov. 25, 2008.

Nakamura, T. et al., "A Touch Panel Function Integrated LCD Including LTPS A/D Converter", SID 05 Digest, (2005), pp. 1054-1055.

\* cited by examiner

DISPLAY DEVICE

This application is the U.S. national phase of International Application No. PCT/JP2008/064526 filed 13 Aug. 2008, which designated the U.S. and claims priority to JP Application No. 2007-215018 filed 21 Aug. 2007, the entire contents of each of which are hereby incorporated by reference.

TECHNICAL FIELD

The present invention relates to a display device with a photosensor having a photodetection element such as a photodiode in a pixel thereof.

BACKGROUND ART

Conventionally, there has been proposed a display device with a photosensor that can detect the brightness of ambient light due to including a photodetection element such as a photodiode outside the pixel region. Such display devices with a photosensor can, for example, adjust the amount of backlight according to the brightness of the ambient light, and have been employed in mobile information display terminals and the like. Also, there has been proposed a display device with an image reading function that, due to including a photodetection element inside the pixel region, can read an image of an object that has come close to the display. Such display devices with an image reading function are anticipated to be used as bidirectional communication display devices and display devices with a touch panel function.

With conventional display devices such as those described above, when using a semiconductor process to form known constituent elements such as signal lines, scan lines, TFTs (Thin Film Transistor), and pixel electrodes on the active matrix substrate, a photodiode is simultaneously formed as a photodetection element either inside the pixel region or outside the pixels region of the active matrix substrate (see JP 2006-3857A).

DISCLOSURE OF INVENTION

Problem to be Solved by the Invention

There are of course also plans for the above conventional display devices including a photosensor to be mounted in mobile devices such as mobile phones, personal computers, and PDAs (Personal Digital Assistant). In this way, particularly in the case of inclusion in mobile devices, there is desire for the dynamic range of the photosensor to be wide in order to be able to highly accurately perform brightness detection with the photosensor.

In order to improve the dynamic range of the photosensor, it is necessary to also improve the dynamic range of the photodetection element itself. However, improving photodetection element performance has generally not been easy due to the need for, for example, changes in the manufacturing process.

With photosensors that include a photodiode as the photodetection element, a system in which output current from the photodiode is stored in a capacitor is commonplace. In this case, the change in the potential of the capacitor is the output of the photosensor. In order to increase the dynamic range of the photosensor (i.e., the amount of change in the potential of the capacitor), the charging time of the capacitor should be made variable, or the capacitance of the capacitor should be made variable. However, depending on the device to which the photosensor is applied, there are cases in which there are limits on the charging period. In particular, in cases such as the case of being applied to a pointing device for which high-speed response is demanded (e.g., a touch panel), there is no leeway in terms of time for making the charging period variable.

An object of the present invention is to provide a display device with a photosensor, and in particular a display device whose photosensor has a wide dynamic range.

Means for Solving Problem

A feature of the present invention is that the capacitance of the capacitor of the photosensor is changed by changing the bias potential of the capacitor. Accordingly, there are no big changes to the manufacturing process for the photosensor, and it is possible to provide a photosensor having a wide dynamic range. Also, there is the advantage that high-speed response is not impaired since there is no change to the charging period of the capacitor.

EFFECTS OF THE INVENTION

According to the present invention, it is possible to provide a display device with a photosensor, and in particular a display device having a wide dynamic range.

DESCRIPTION OF THE INVENTION

Figure 1:
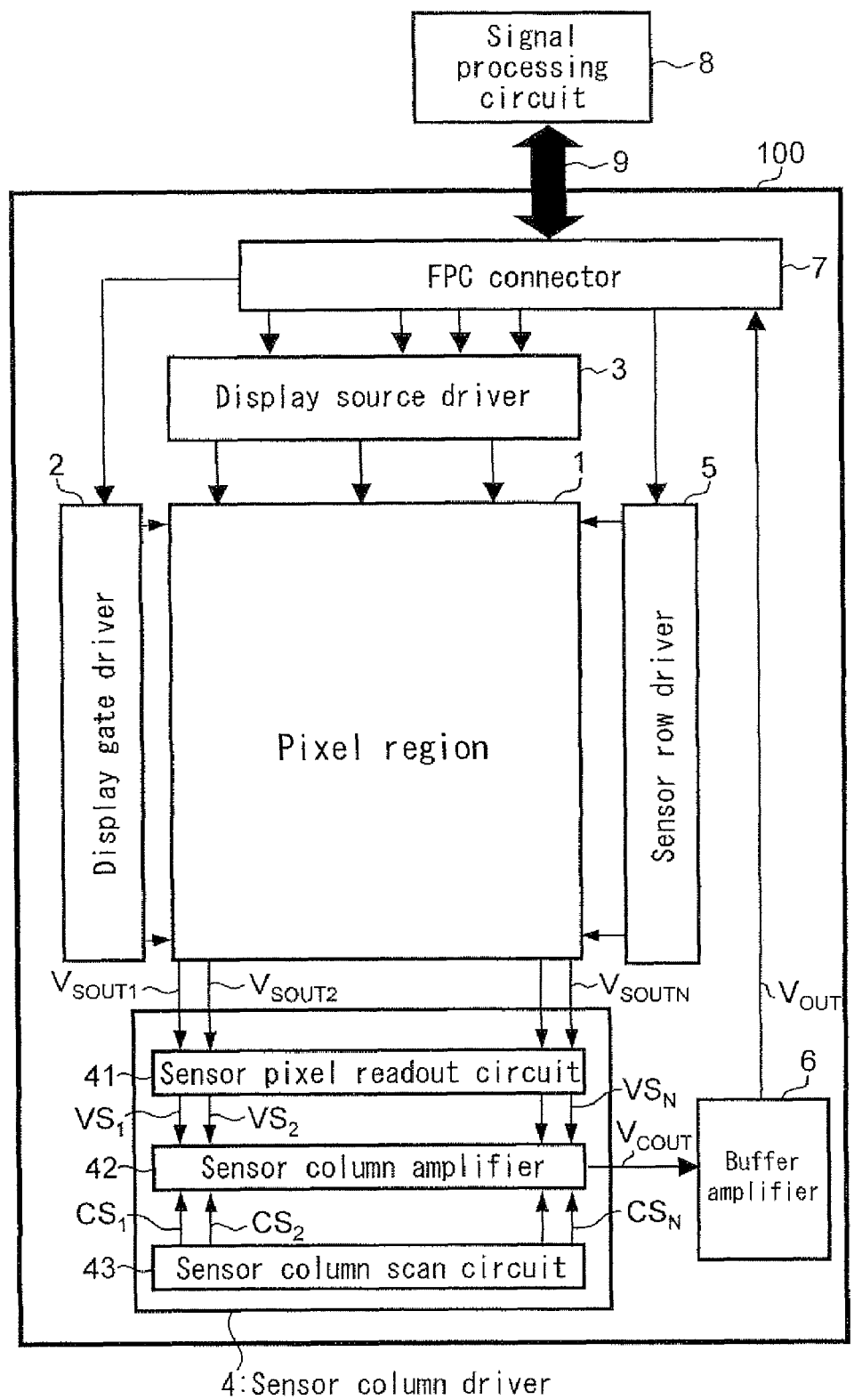
FIG. 1 is a block diagram showing a schematic configuration of a display device according to an embodiment of the present invention.

A display device according to an embodiment of the present invention is a display device provided with an active matrix substrate, and including: a photosensor provided on the active matrix substrate; sensor driving bus line connected to the photosensor; a sensor driving circuit that supplies a sensor driving signal to the photosensor via the sensor driving bus line; an amplifier circuit that amplifies sensor output that has been read out from the photosensor in accordance with the sensor driving signal, and outputs the amplified sensor output as a photosensor signal; and a signal processing circuit that processes the photosensor signal that has been output from the amplifier circuit, wherein the photosensor includes a photodiode, a capacitor that is connected to the photodiode, and at least one switching element, the sensor driving bus line includes at least reset signal bus line that supplies a reset signal to the photosensor, and readout signal bus line that supplies a readout signal to the capacitor, clue to the sensor driving circuit switching ON the readout signal after a predetermined time has elapsed since switching ON the reset signal, a photosensor signal that is in accordance with an amount of light received by the photosensor in the predetermined time is output to the signal processing circuit, and due to the sensor driving circuit changing the bias voltage of the capacitor, the capacitance of the capacitor is variable.

According to this configuration, the capacitance of the capacitor is variable due to the sensor driving circuit changing the bias voltage of the capacitor, thus enabling providing a photosensor that has a wide dynamic range, without a big change in the manufacturing process for the photosensor. Also, there is no impairment to the high-speed response of the photosensor since there is no change in the charging period of the capacitor.

In the display device according to the above configuration, it is preferable that due to the sensor driving circuit changing the bias voltage of the capacitor, the capacitance of the capacitor is reduced in at least part of a period from when the reset signal is supplied until when the predetermined time has elapsed.

Also, in the display device according to the above configuration, it is preferable that the capacitor includes a metal layer and a silicon layer that has a semiconductor junction, and in at least part of the period from when the reset signal is supplied until when the predetermined time has elapsed, the sensor driving circuit causes the bias voltage of the capacitor to be smaller than a threshold voltage of the semiconductor junction. Alternatively, a configuration is possible in which the capacitor includes a metal layer and a silicon layer that configures a Schottky junction between the metal layer and the silicon layer, and in at least part of the period from when the reset signal is supplied until when the predetermined time has elapsed, the sensor driving circuit causes the bias voltage of the capacitor to be smaller than a threshold voltage of the Schottky junction.

In the display device according to the above configuration, a configuration is possible in which the photosensor is provided in a pixel region of the active matrix substrate, the photosensor includes one switching element, a cathode of the photodiode of the photosensor is connected to one electrode of the capacitor and the switching element, and an anode of the photodiode is connected to the reset signal bus line, and the readout signal bus line is connected to the other electrode of the capacitor.

In the display device according to the above configuration, it is preferable that in part of the period from when the reset signal is supplied until when the predetermined time has elapsed, a low level potential of the readout signal is lower than a low level potential of the reset signal.

In the display device according to the above configuration, it is preferable that a high level potential of the reset signal is higher than the low level potential of the reset signal outside the period, by only an amount that is $\Delta V_{RST} \cdot C_{PD}/C_T$. Accordingly, it is possible to compensate for the voltage drop caused by intrapixel parasitic capacitance. Furthermore, preferably, when the reset signal is switched ON, the potential of the readout signal is higher than the low level potential of the readout signal.

Also, the display device according to the above configuration preferably includes a light shielding layer on a back face of the capacitor. This enables solving the problem of light leakage in the capacitor.

In the display device according to the above configuration, a configuration is possible in which the photosensor is provided in a pixel region of the active matrix substrate, the photosensor comprises a first switching element, a second switching element, and a third switching element, a cathode of the photodiode of the photosensor is connected to one electrode of the capacitor, a drain of the first switching element, and a gate of the second switching element, and an anode of the photodiode is kept at a first reference potential, a source of the first switching element and a source of the second switching element are kept at a second reference potential, a drain of the second switching element is connected to a source of the third switching element, a gate of the third switching element is connected to the readout signal bus line, and the other electrode of the capacitor is connected to a supply line for a mode signal that switches a dynamic range of the photosensor. In this configuration, it is furthermore preferable that the supply line for the mode signal is connected to the second reference potential in at least part of the period from when the reset signal is supplied until when the predetermined time has elapsed, and outside the period, the supply line for the mode signal is connected to the first reference potential.

Below is a description of more specific embodiments of the present invention with reference to the drawings. Note that although the following embodiments show examples of configurations in which a display device according to the present invention is implemented as a liquid crystal display device, the display according to the present invention is not limited to a liquid crystal display device, and is applicable to an arbitrary display device that uses an active matrix substrate. It should also be noted that the display device according to the present invention is envisioned to be used as, for example, a display device with a touch panel that performs input operations by detecting an object that has come close to the screen, or a bidirectional communication display device that is equipped with a display function and an image capture function, due to having an image reading function.

Also, for the sake of convenience in the description, the drawings that are referenced to below show simplifications of, among the constituent members of the embodiments of the present invention, only relevant members that are necessary for describing the present invention. Accordingly, the display device according to the present invention may include arbitrary constituent members that are not shown in the drawings that are referenced to in this specification. Also, regarding the dimensions of the members in the drawings, the dimensions of the actual constituent members, the ratios of the dimensions of the members, and the like are not shown faithfully.

[Embodiment 1]

First, a configuration of an active matrix substrate included in a liquid crystal display device according to Embodiment 1 of the present invention is described with reference to FIGS. 1 and 2.

FIG. 1 is a block diagram showing a schematic configuration of an active matrix substrate 100 included in the liquid crystal display device according to Embodiment 1 of the present invention. As shown in FIG. 1, the active matrix substrate 100 includes at least a pixel region 1, a display gate driver 2, a display source driver 3, a sensor column driver 4, a sensor row driver 5, a buffer amplifier 6, and an FPC connector 7 on a glass substrate. Also, a signal processing circuit 8 for processing image signals read by a photodetection element (described later) in the pixel region 1 is connected to the active matrix substrate 100 via the FPC connector 7 and an FPC 9.

Note that the above constituent members on the active matrix substrate 100 can also be formed monolithically on the glass substrate by a semiconductor process. Alternatively, a configuration is possible in which the amplifier and various drivers among the above constituent members are mounted on the glass substrate by COG (Chip On Glass) technology or the like. As another alternative, it is possible for at least a portion of the above constituent members shown on the active matrix substrate 100 in FIG. 1 to be mounted on the FPC 9. The active matrix substrate 100 is laminated together with a common substrate (not shown) that has common electrodes formed on the entire face thereof, and a liquid crystal material is enclosed in the gap therebetween.

The pixel region 1 is a region in which a plurality of pixels are formed in order to display an image. In the present embodiment, a photosensor for reading an image is provided in each pixel in the pixel region 1. FIG. 2 is an equivalent circuit diagram. showing the disposition of the pixels and photosensors in the pixel region 1 of the active matrix substrate 100. In the example in FIG. 2, each pixel is formed by three colors of picture elements, namely R (red), G (green), and B (blue), and one photosensor is provided in each of the pixels configured by these three picture elements. The pixel region 1 has pixels disposed in a matrix having M rows×N columns, and photosensors that are likewise disposed in a matrix having M rows×N columns. Note that as described above, the number of picture elements is M×3N.

Figure 2:
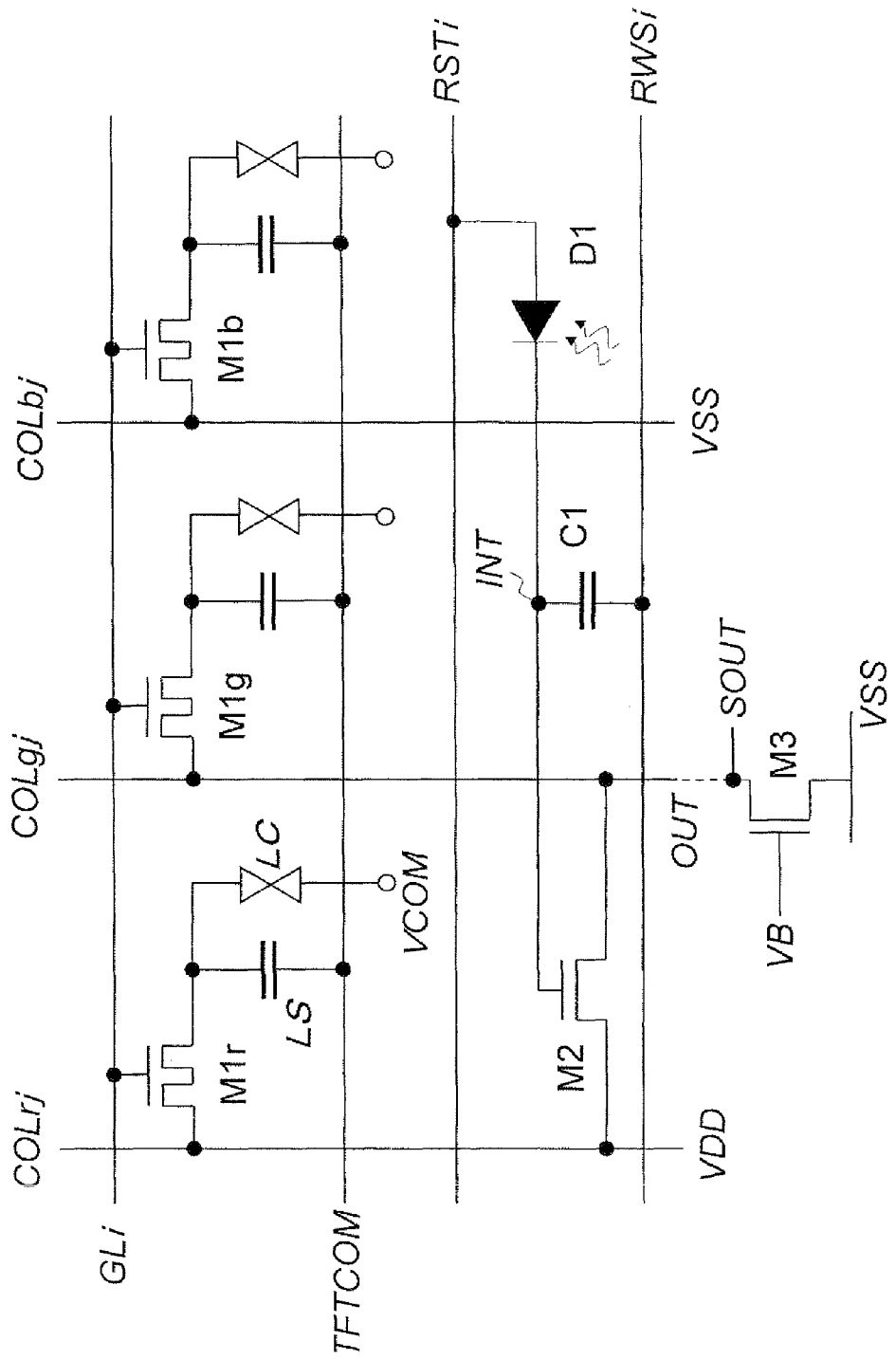
FIG. 2 is an equivalent circuit diagram showing a configuration of a pixel in the display device according to an embodiment of the present invention.

For this reason, as shown in FIG. 2, the pixel region 1 has, as bus line for the pixels, gate lines GL and source lines COL that are disposed in a matrix. The gate lines GL are connected to the display gate driver 2. The source lines COL are connected to the display source driver 3. Note that the gate lines GL are provided in M rows in the pixel region 1. Hereinafter, the notation GLi(i=1 to M) is used when there is a need to distinguish between individual gate lines GL in the description. Meanwhile, three of the source lines COL are provided in each pixel in order to respectively supply image data to the three picture elements in each pixel as described above. The notations COLrj, COLgj, and COLbj (j=1 to N) are used when there is a need to distinguish between individual source lines COL in the description.

Thin film transistors (TFT) M1 are provided as switching elements for the pixels at intersections between the gate lines GL and the source lines COL. Note that in FIG. 2, the thin film transistors M1 provided in the red, green, and blue picture elements are noted as M1r, M1g, and M1b respectively. In each thin film transistor M1, the gate electrode is connected to one of the gate lines GL, the source electrode is connected to one of the source lines COL, and the drain electrode is connected to a pixel electrode that is not shown. Accordingly, as shown in FIG. 2, a liquid crystal capacitance LC is formed between the drain electrode of each thin film transistor M1 and a common electrode (VCOM). Also, an auxiliary capacitance LS is formed between each drain electrode and a TFT-COM.

In FIG. 2, the picture element driven by the thin film transistor M1r, which is connected to the intersection between one of the gate lines GLi and one of the source lines COLrj, is provided with a red color filter so as to correspond to that picture element, and red image data is supplied from the display source driver 3 to that picture element via the source line COLrj, and thus that picture element functions as a red picture element. Also, the picture element driven by the thin film transistor M1g, which is connected to the intersection between the gate line GLi and the source line COLgj, is provided with a green color filter so as to correspond to that picture element, and green image data is supplied from the display source driver 3 to that picture element via the source line COLgj, and thus that picture element functions as a green picture element. Furthermore, the picture element driven by the thin film transistor M1b, which is connected to the intersection between the gate line GLi and the source line COLbj, is provided with a blue color filter so as to correspond to that picture element, and blue image data is supplied from the display source driver 3 to that picture element via the source line COLbj, and thus that picture element functions as a blue picture element.

Note that in the example in FIG. 2, the photosensors are provided in the ratio of one per pixel (three picture elements) in the pixel region 1. However, the disposition ratio of the pixels and photosensors is arbitrary and not limited to merely this example. For example, one photosensor may be disposed per picture element, and a configuration is possible in which one photosensor is disposed for a plurality of pixels.

As shown in FIG. 2, the photosensor is configured by a photodiode D1 as a photodetection element, a capacitor C1, and a transistor M2. The capacitor C1 is formed at the same time as and by the same semiconductor process as when forming the TFT M1, which is a pixel switching element. The structure of the capacitor C1 is described in detail later. In the example in FIG. 2, source lines COLb and COLr also play the role of bus line VSS and VDD, which are for supplying constant voltages $V_{SS}$ and $V_{DD}$ from the sensor column driver 4 to the photosensor. Also, a source line COLg also plays the role of bus line OUT for sensor output.

The anode of the photodiode D1 is connected to bus line RST, which is for supplying a reset signal. The cathode of the photodiode D1 is connected to one electrode of the capacitor C1 and the gate of a transistor M2. The drain of the transistor M2 is connected to the bus line VDD, and the source is connected to the bus line OUT. In FIG. 2, the intersection between the cathode of the photodiode D1, the one electrode of the capacitor C1, and the gate of the transistor M2 is noted as INT.

The other electrode of the capacitor C1 is connected to bus line RWS, which is for supplying a readout signal. The bus line RST and RWS are connected to the sensor row driver 5. Since the bus line RST and RSW are provided in each row, the notations RSTi and RWSi (i=1 to M) are used hereinafter when there is a need to distinguish between the bus line.

The sensor row driver 5 successively selects each group of bus line RSTi and RWSi shown in FIG. 2 at a predetermined time interval $t_{row}$. Accordingly, each photosensor row in the pixel region 1 from which a signal charge is to be read is successively selected.

Note that as shown in FIG. 2, the end of the bus line OUT is connected to the drain of an insulated gate field effect transistor M3. Also, the drain of this transistor M3 is connected to output bus line SOUT, and a potential $V_{SOUT}$ of the drain of the transistor M3 is output to the sensor column driver 4 as an output signal from the photosensor. The source of the transistor M3 is connected to the bus line VSS. The gate of the transistor M3 is connected to a reference voltage power supply (not shown) via reference voltage bus line VB.

Note that the circuit configuration shown in FIG. 2 is nothing more than merely an example, and the circuit configuration of the photosensor according to the present invention is not limited to only the concrete example in FIG. 2.

Figure 3:
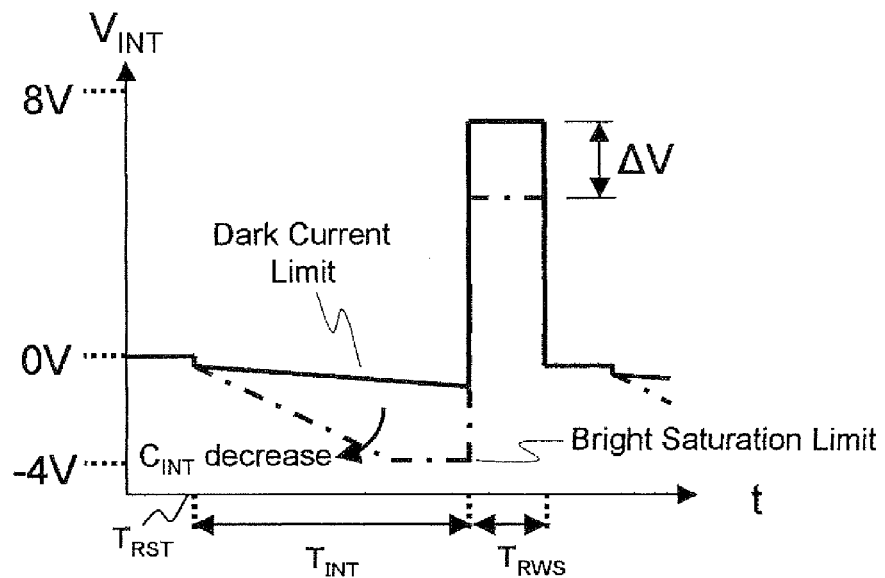
FIG. 3 is a timing diagram showing a condition in which a potential VINT at a connection point INT changes according to signals that are applied to bus line RST and RWS in a high capacitance mode.
Figure 4:
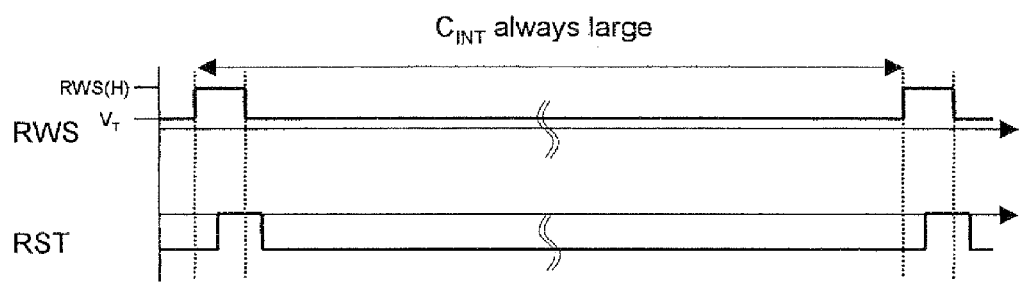
FIG. 4 is a timing chart showing waveforms of a reset signal and a readout signal.

The following describes basic operations for reading out sensor output from photosensors each including one transistor M2 as shown in FIG. 2, with reference to FIGS. 3 and 4. FIG. 3 is a timing diagram showing a condition in which a potential $V_{INT}$ of the connection point INT changes according to signals that are applied to the bus line RST and RWS. FIG. 4 is a timing chart showing waveforms of the signals applied to the bus line RST and RWS. For example, a high level RST(H) of the reset signal RST shown in FIG. 4 is 0 V, and a low level RST(L) thereof is −4 V. Also, for example, a high level RWS(H) of the readout signal RWS is 8 V, and a low level RWS(L) thereof is $V_T$. $V_T$ is the threshold potential (described in detail later) of the P-N junction of the capacitor C1.

In FIG. 4, the period in which the readout signal RWS is at the high level (RWS(H)) corresponds to a readout period $T_{RWS}$ in FIG. 3. Also, the time point when the reset signal RST in FIG. 4 changes from the high level (RST(H)) to the low level (RST(L)) corresponds to a reset time $T_{RST}$ in FIG. 3. Furthermore, the period from when the reset signal RST has fallen to the low level (RST(L)) until when the readout signal RWS next rises to the high level (RWS(H)) is an integral period $TR_{INT}$.

First, when the reset signal supplied from the sensor row driver 5 to the bus line RST rises from the low level (−4 V) to the high level (0 V), the photodiode D1 becomes forward biased, and the potential $V_{INT}$ of the connection point INT is obtained as expressed by Expression (1) below.

$$V_{INT}=RST(H)-V_F-\Delta V_{RST}\cdot C_{PD}/C_T \quad (1)$$

In Expression (1), $V_F$ is the forward voltage of the photodiode D1, $\Delta V_{RST}$ is the height of the reset signal pulse, and $C_{PD}$ is the capacitance of the photodiode D1. $C_T$ is the total capacitance of the connection point INT, which is the total of a capacitance $C_{INT}$ of the capacitor C1, the capacitance $C_{PD}$ of the photodiode D1, and a capacitance $C_{TFT}$ of the transistor M2. Since VINT at this time is lower than the threshold voltage of the transistor M2, the transistor M2 is in a non-conductive state. Note that the readout signal is at the high level (RWS(H)) at this time.

Next, the readout signal falls to the low level (RWS(L)). Subsequently, the reset signal falls to the low level (RST(L)). This state is a state in which the reset signal has been switched ON, and the photosensor is reset.

Note that the integral period ($T_{INT}$) starts when the reset signal has been switched ON. In the integral period, a photoelectric current that is proportional to the amount of light that has incidented on the photodiode D1 flows to the capacitor C1 and causes the capacitor C1 to discharge. Accordingly, the potential. $V_{INT}$ of the connection point INT when the integral period has ended is obtained as expressed by Expression (2) below.

$$V_{INT}=RST(H)-V_F-\Delta V_{RST}\cdot C_{PD}/C_T-I_{PHOTP}\cdot t_{INT}/C_T \quad (2)$$

In Expression (2), $I_{PHOTO}$ is the photoelectric current of the photodiode D1, and $t_{INT}$ is the length of the integral period. In the integral period as well, $V_{INT}$ is lower than the threshold voltage of the transistor M2, and therefore the transistor M2 is in the non-conductive state.

Next, due to the readout signal rising to the high level (RWS(H)), the readout signal enters the ON state, the readout period begins, and charge injection on the capacitor C1 occurs. The potential VINT of the connection point INT at this time is obtained as expressed by Expression (3) below.

$$V_{INT}=RST(H)-V_F-\Delta V_{RST}\cdot C_{PD}/C_T-I_{PHOTO}\cdot t_{INT}/C_T+\Delta V_{RWS}\cdot C_{INT}/C_T \quad (3)$$

$\Delta V_{RWS}$ is the height of the rising pulse of the readout signal (RWS(H)−RWS(L)), and therefore since the potential $V_{INT}$ of the connection point INT is higher than the threshold voltage of the transistor M2, the transistor M2 enters a conductive state and functions as a source follower amplifier along with the bias transistor M3 provided at the end of the bus line OUT in each column. In other words, the output signal voltage from the output bus line SOUT from the drain of the transistor M3 corresponds to the integral value of the photoelectric current of the photodiode D1 in the integral period.

Next, the reset signal rises to the high level (RST(H)), and thereafter the same operations as above are repeated. As described above, the display device according to the present embodiment cyclically performs operations in which one cycle involves initialization by a reset pulse, integration of the photoelectric current in the integral period, and reading of sensor output in the readout period.

As shown in FIG. 3, according to the above one cycle of operations, the potential $V_{INT}$ in the readout period $T_{RWS}$ takes the value of either the potential in a state in which there is little light (solid line in FIG. 3) or the potential in a state of saturation with light (dashed dotted line in FIG. 3). In other words, $\Delta V$ shown in FIG. 3 corresponds to the size of the dynamic range of the photosensor.

Note that the above readout operations shown in FIGS. 3 and 4 are an operation mode in which the capacitance of the capacitor C1 is in a state of being constantly large, and the dynamic range is not very wide. The photosensor according to the present embodiment has an operation mode in which the dynamic range is wide due to, as is be described below, making the capacitance of the capacitor C1 variable by changing the bias potential of the capacitor C1 in at least the integral period.

Hereinafter, in order to distinguish between these operation modes, the former is called the high capacitance mode, and the latter is called the low capacitance mode.

Figure 5:
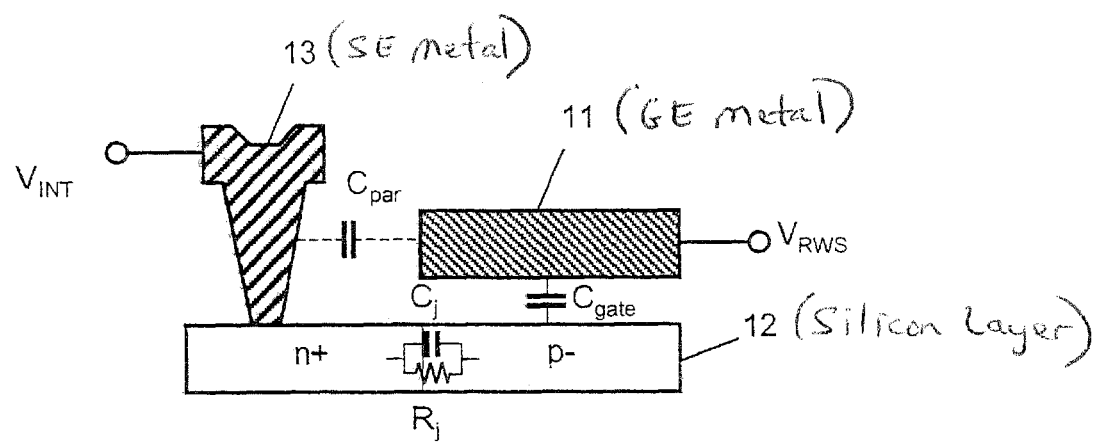
FIG. 5 is a cross-sectional schematic diagram showing a configuration of a capacitor included in a photosensor according to an embodiment of the present invention.

The following describes the structure of the capacitor C1 with reference to FIG. 5. As shown in FIG. 5, the capacitor C1 is configured by a GE metal 11, a silicon layer 12, and an SE metal 13. The GE metal 11 is formed as the same layer as the gate electrodes of the TFTs in the pixel region of the active matrix substrate 100, using the same material as and by the same process as the gate electrodes. Also, the SE metal 13 is formed as the same layer as the source electrodes of the TFTs, using the same material as and by the same process as the source electrodes. In the example in FIG. 5, a semiconductor junction is formed in the silicon layer 12 by an n+ layer and a p− layer. The GE metal 11 is provided as a layer above the p− layer of the silicon layer 12. Accordingly, the GE metal 11 and the p− layer of the silicon layer 12 function as a pair of electrodes in the capacitor C1. The GE metal 11 is connected to the readout signal bus line RWS that applies the readout signal $Y_{RWS}$. The potential of the SE metal 13 corresponds to the potential $V_{INT}$ of the connection point INT.

Figure 6A:
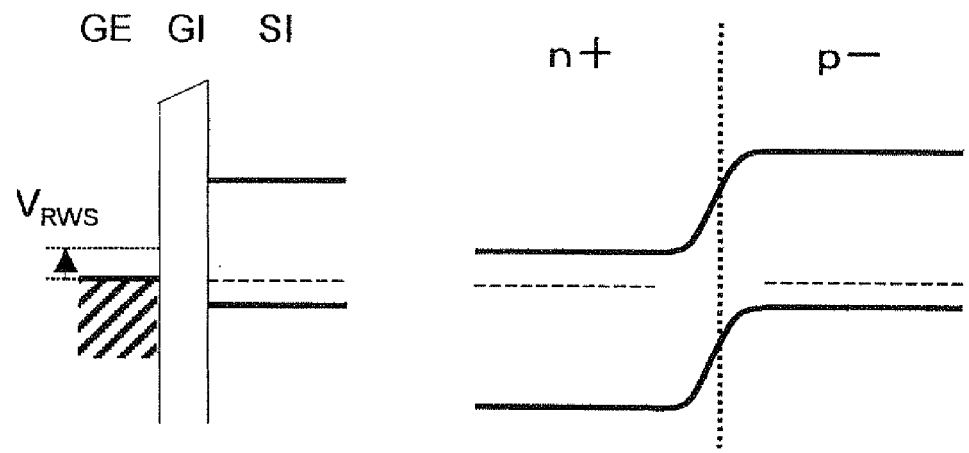
FIG. 6A shows energy bands in a state in which a bias potential $V_{CAP}$ of the capacitor of the photosensor is lower than a threshold potential $V_T$ of a P-N junction. Also.
Figure 6B:
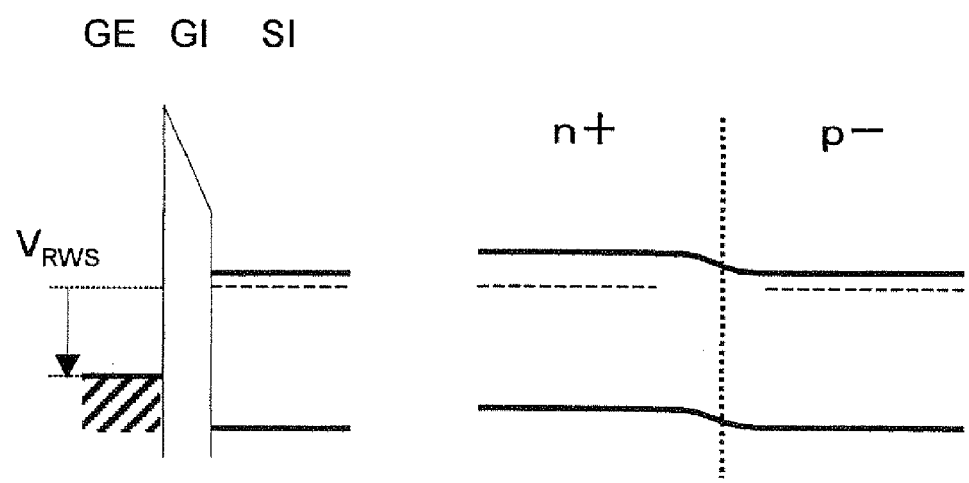
FIG. 6B shows energy bands in a state in which the bias potential $V_{CAP}$ of the capacitor is higher than the threshold potential $V_T$ of the P-N junction.
Figure 7A:
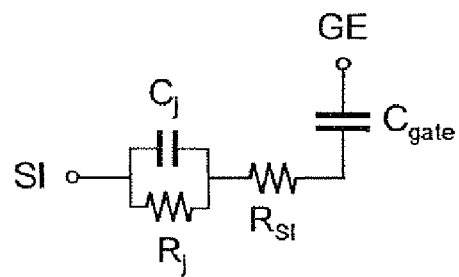
FIGS. 7A and 7B are equivalent circuit diagrams of the states in FIGS. 6A and 6B respectively.
Figure 7B:
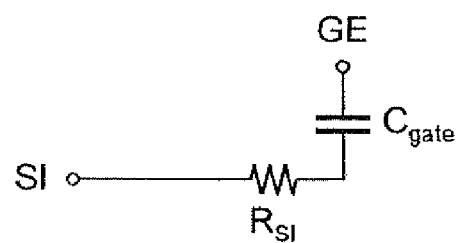
Figure 8:
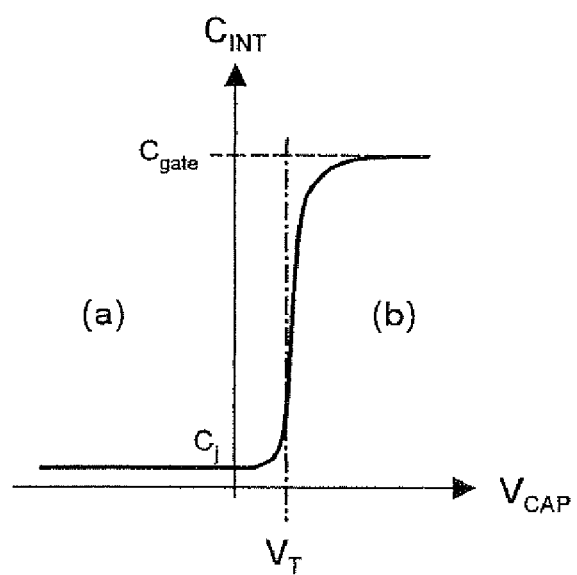
FIG. 8 is a graph showing a relationship between the bias potential $V_{CAP}$ of the capacitor of the photosensor and the capacitance Carr of the capacitor.

In the capacitor C1 according to the above configuration, the capacitor capacitance changes depending on whether the bias potential ($V_{CAP}$) of the capacitor C1 is higher or lower than the threshold potential ($V_T$) that is due to the P-N junction of the silicon layer 12. FIG. 6A shows energy bands in the state in which $V_{CAP}$ is lower than $V_T$. Also, FIG. 6B shows energy bands in the state in which $V_{CAP}$ is higher than $V_T$. FIGS. 7A and 7B are equivalent circuit diagrams of the states in FIGS. 6A and 6B respectively. In the state shown in FIG. 7B, $C_{INT}$, which is the capacitance of the capacitor C1, is equal to a capacitance $C_{gate}$ between the GE metal 11 and the silicon layer 12. On the other hand, in the state shown in FIG. 7A, $C_j$, which is the capacitance of the P-N junction, is much smaller than the capacitance $C_{gate}$ between the GE metal 11 and the silicon layer 12. Accordingly, as a resistance $R_j$ of the P-N junction approaches infinity, the capacitance $C_{INT}$ of the capacitor C1 approaches $C_j$. However, as the resistance $R_j$ decreases, $C_{INT}$ becomes greater than $C_j$. Accordingly, the relationship between the bias voltage $V_{CAP}$ of the capacitor C1 and the capacitance $C_{INT}$ of the capacitor C1 is as shown in the graph of FIG. 8. Specifically, regions (a) and (b) shown in FIG. 8 correspond to the states shown in FIGS. 7A and 7B respectively. As is evident from FIG. 8, the capacitance $C_{INT}$ of the capacitor C1 can be made variable between $C_j$ and $C_{gate}$ by changing the bias voltage $V_{CAP}$ of the capacitor C1.

Note that likewise effects can be obtained even if the combination forming the semiconductor junction in the silicon layer 12 of the capacitor C1 is changed. For example, the side connected to the SE metal 13 may be a p+ layer, and the side opposing the GE metal 11 may be an n− layer. Likewise, the side connected to the SE metal 13 may be an n+ layer, and the side opposing the GE metal 11 may be an i layer. Alternatively, the side connected to the SE metal 13 may be a p+ layer, and the side opposing the GE metal 11 may be an i layer.

Also, even if a semiconductor junction does not exist in the silicon layer 12, and even in the case of a configuration in which a Schottky junction is formed between the silicon layer 12 and the SE metal 13, likewise to the above, the capacitance $C_{INT}$ of the capacitor C1 can be made variable between $C_j$ and $C_{gate}$ by changing the bias voltage $V_{CAP}$ of the capacitor C1. In this case, it is sufficient for the silicon layer 12 to be configured by a single i layer.

Figure 9:
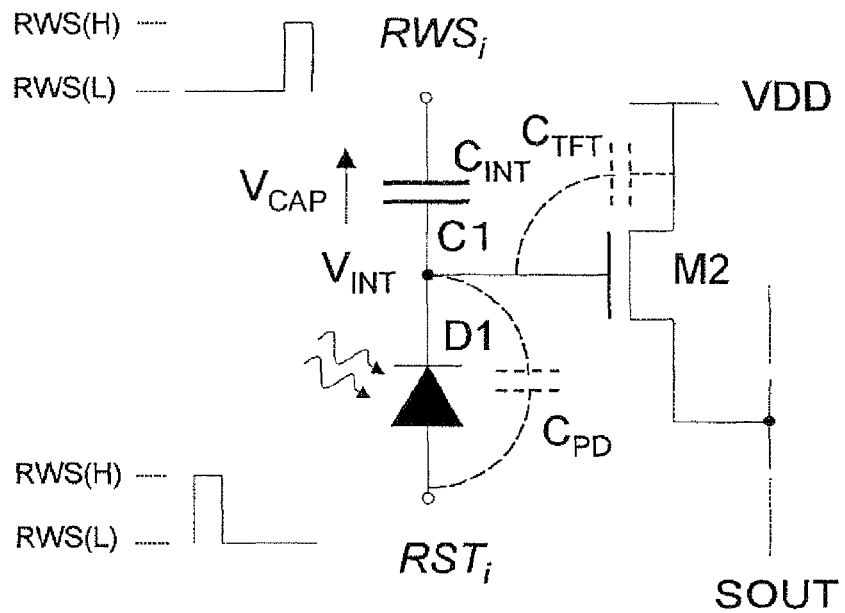
FIG. 9 is an equivalent circuit diagram showing a configuration of a photosensor including one switching element.

Below is a description of operations in the low capacitance mode of the photosensor according to the present embodiment with reference to FIGS. 9 and 10. As shown in FIG. 9, $C_{INT}$ is the capacitance of the capacitor C1, $V_{CAP}$ is the bias voltage of the capacitor C1, $C_{TFT}$ is the parasitic capacitance of the thin film transistor M2, and $C_{PD}$ is the parasitic capacitance of the photodiode.

Figure 10:
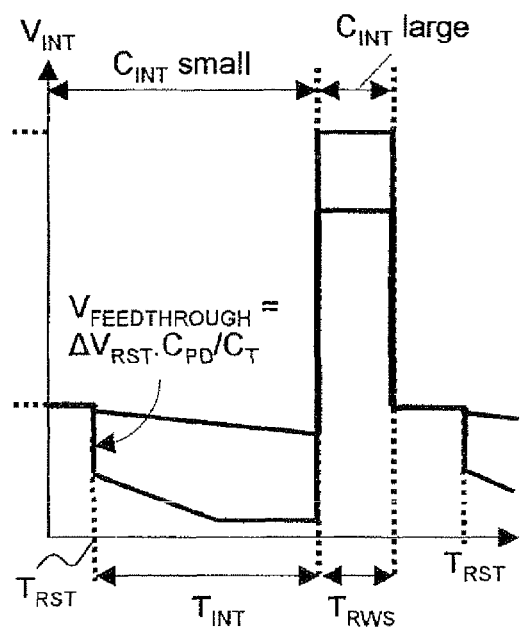
FIG. 10 is a timing diagram showing a condition in which the potential WIT of the connection point INT changes according to signals that are applied to the bus line RST and RWS in a low capacitance mode.

In the configuration shown in FIG. 9, the capacitor characteristics shown in FIG. 8 can be realized by changing the potential $V_{RWS}$ of the readout signal (RWS) applied to the GE metal 11 of the capacitor C1 in the charging period ($T_{INT}$ shown in FIG. 10). In other words, as previously described, if the value of the bias voltage $V_{CAP}$ of the capacitor C1 rises higher than $V_T$, sensitivity as a photosensor decreases. On the other hand, if the value of $V_{CAP}$ falls below $V_T$, sensitivity as a photosensor improves, and the dynamic range becomes wider. Note that $V_{CAP}=V_{RWS}=V_{INT}$.

In the charging period $T_{INT}$ shown in FIG. 10, the readout signal (RWS) is controlled such that the capacitance $C_{INT}$ of the capacitor C1 decreases. Also, in the readout period $T_{RWS}$ shown in FIG. 10, the readout signal is biased to the high level, and the capacitance $C_{INT}$ of the capacitor C1 rises. Accordingly, the accumulated current in the capacitor C1 is properly read in the readout period $T_{RWS}$. Also, it is necessary for the capacitance $C_{INT}$ of the capacitor C1 to be large at the reset time $T_{RST}$. The reason for this is described further below.

In order to change the capacitance of the capacitor C1 as described above, it is sufficient to apply the readout signal (RWS) in a pattern such as is shown in FIG. 9. Note that in FIG. 11, the period in which the readout signal RWS is at the high level (RWS(H)) corresponds to the readout period $T_{RWS}$ in FIG. 10. Also, the time point when the reset signal RST in FIG. 11 changes from the high level (RST(H)) to the low level (RST(L)) corresponds to the reset time $T_{RST}$ in FIG. 10. Furthermore, the period from when the reset signal RST has fallen to the low level (RST(L)) until when the readout signal RWS next rises to the high level (RWS(H)) is the integral period $T_{INT}$.

Figure 11:
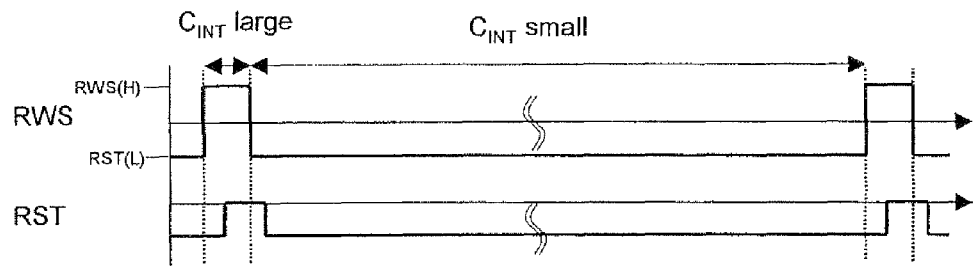
FIG. 11 is a timing chart showing examples of waveforms of a reset signal and a readout signal in the low capacitance mode of the photosensor in Embodiment 1.

In the example in FIG. 11, in order to improve the dynamic range of the photosensor by decreasing the capacitance $C_{INT}$ of the capacitor C1 in at least the integral period $T_{INT}$, the low level potential RWS(L) of the readout signal RWS is set equal to the low level potential RST(L) of the reset signal RST. Note that in order to obtain the effect of improving the dynamic range, it is preferable that the bias voltage $V_{CAP}$ of the capacitor C1 is maintained at a value that is smaller than the threshold potential $V_T$ of the capacitor C1 in at least the integral period $T_{INT}$. In other words, it is preferable that:

$$V_{CAP}=RWS(L)-V_{INT}<V_T$$

It is thus evident that it is sufficient for the following relationship to exist.

$$RWS(L)<V_{INT}+V_T \approx RST(L)+V_T$$

However, according to the driving method in FIG. 11, when the reset signal RST is switched ON, that is to say, at the time point when the reset signal RST changes from the high level (RST(H)) to the low level (RST(L)), the value of the capacitance $C_{INT}$ of the capacitor C1 is low, and the influence of the voltage drop caused by parasitic capacitance thus increases, and as a result, the change in the potential of the capacitor C1 becomes immediately saturated. Consequently, there are cases in which the dynamic range of the output change becomes narrower, which is the opposite of the desired effect. For this reason, driving methods such as those shown in FIGS. 12 and 13 are possible improvements on the driving method in FIG. 11.

Figure 12:
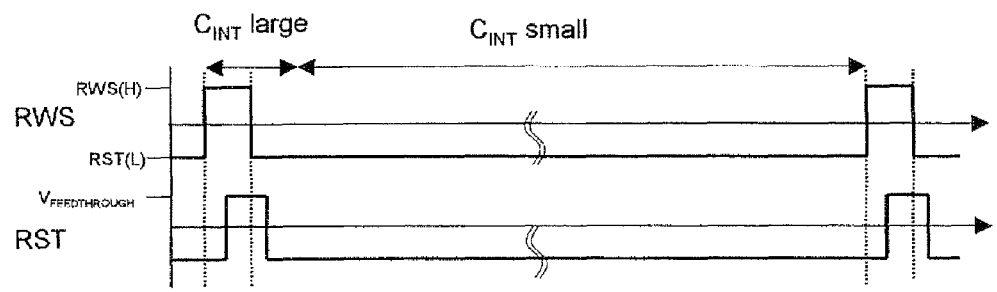
FIG. 12 is a timing chart showing other examples of waveforms of the reset signal and the readout signal in the low capacitance mode of the photosensor in Embodiment 1.
Figure 13:
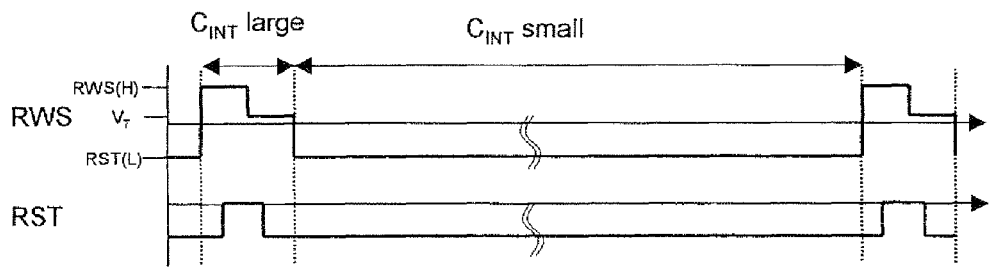
FIG. 13 is a timing chart showing yet other examples of waveforms of the reset signal and the readout signal in the low capacitance mode of the photosensor in Embodiment 1.

In the driving method shown in FIG. 12, in order to compensate for the amount of voltage drop ($V_{FEEDTHROUGH}$) that can be calculated from the parasitic capacitance, the high level potential of the RST is raised by only that amount. For example, whereas the RST(H) in the driving method in FIG. 11 is 0 V, in the driving method shown in FIG. 12, the potential is raised from RST(H) by only $V_{FEEDTHROUGH}$. In other words, in FIG. 3.2, the potential of RST(H) is equal to $V_{FEEDTHROUGH}$. Note that:

$$V_{FEEDTHROUGH} = \Delta V_{RST} \cdot C_{PD} / C_T$$

Also, $\Delta V_{RST} = |RST(H) - RST(L)|$, and $C_T = C_{INT} + C_{PD} + C_{TFT}$.

Also, in the driving method shown in FIG. 13, at the time point when the reset signal RST changes from the high level (RST(H)) to the low level (RST(L)), the readout signal RWS is set to the same level as $V_T$ or a higher level than $V_T$. Accordingly, the value of $C_{INT}$ is high when the potential of the reset signal RST drops, and therefore it is possible to reduce the influence of the voltage drop (feedthrough) in the output. However, if the potential of the readout signal RWS is set too high, the influence of the feedthrough of the readout signal itself starts to become large, and therefore ideally the potential of the readout signal RWS when the potential of the reset signal RST drops is preferably the same level as $V_T$.

Figure 14:
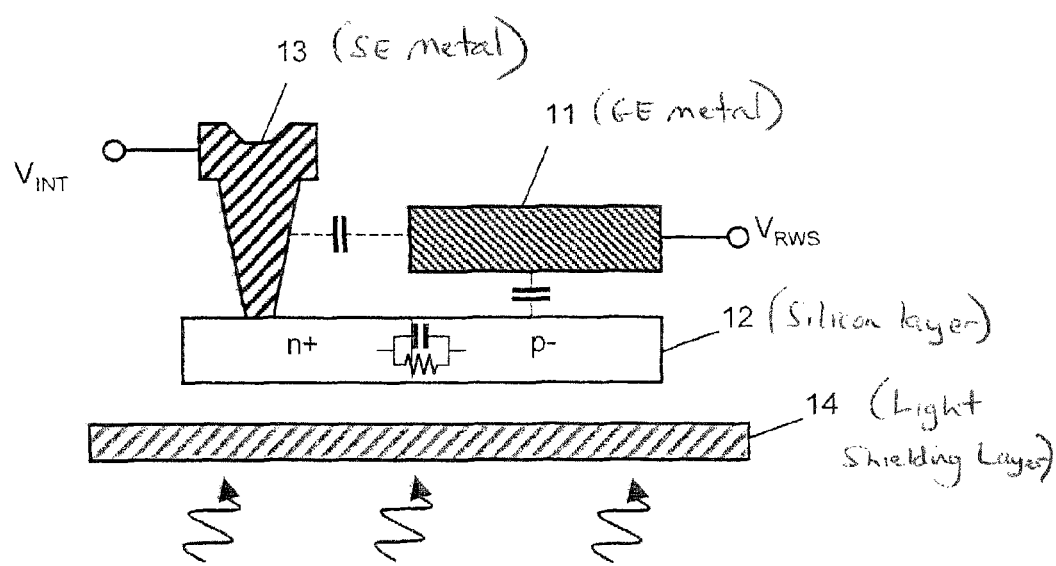
FIG. 14 is a cross-sectional schematic diagram showing another example of a configuration of a capacitor included in a photosensor according to an embodiment of the present invention.

Note that since the silicon layer 12 of the capacitor C1 configured as shown in FIG. 3 has a structure that closely resembles the photodiode D1, a current (light leakage) is generated according to the amount of received light. As a result, the resistance value of the P-N junction falls, and there is an increase in the region in which $C_{INT}$ is smaller than $V_T$, and therefore not only is it impossible to obtain a sufficient change in $C_{INT}$, but also there is influence as an error with respect to the output. For this reason, preferably a light shielding layer 14 for preventing the entrance of light from the backlight is provided below the silicon layer 12 of the capacitor C1 as shown in FIG. 14.

Figure 15:
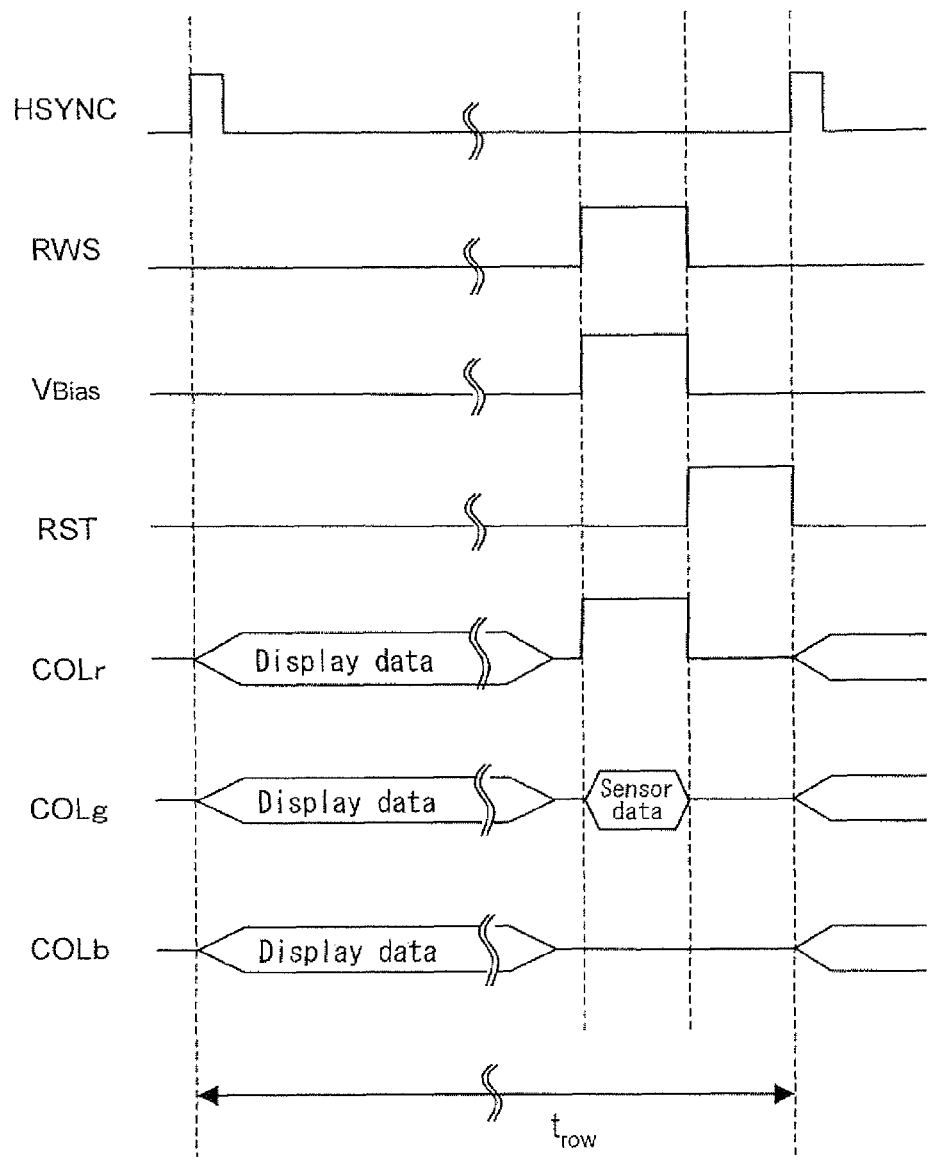
FIG. 15 is a timing chart showing sensor driving timings in a display device according to an embodiment of the present invention.

In the present embodiment, as previously described, the source lines COLr, COLg, and COLb are also used as the photosensor bus line VDD, OUT, and VSS, and therefore as shown in FIG. 15, it is necessary to distinguish between timings when image data signals for display are input via the source lines COLr, COLg, and COLb, and timings when sensor output is read via the source lines COLr, COLg, and COLb. In the example in FIG. 15, after the input of the image data signal for display in a horizontal scan period has ended, the reading out of sensor output is performed using a horizontal blanking period or the like.

As shown in FIG. 1, the sensor column driver 4 includes a sensor pixel readout circuit 41, a sensor column amplifier 42, and a sensor column scan circuit 43. The sensor pixel readout circuit 41 is connected to the bus line SOUT (see FIG. 2) that outputs the sensor output $V_{SOUT}$ from the pixel region 1. In FIG. 1, the sensor output that is output by bus line $SOUT_j$ (j=1 to N) is noted as $V_{SOUTj}$. The sensor pixel readout circuit 41 outputs peak hold voltages $V_{Sj}$ of the sensor output $V_{SOUTj}$ to the sensor column amplifier 42. The sensor column amplifier 42 includes an N number of column amplifiers that correspond one-to-one with the photosensors in the N columns in the pixel region 1, and the column amplifiers respectively amplify the peak hold voltages $V_{Sj}$ (j=1 to N), and output the resulting peak hold voltages to the buffer amplifier 6 as $V_{COUT}$. The sensor column scan circuit 43 outputs column select signals $CS_j$ (j=1 to N) to the sensor column amplifier 42 in order to successively connect the column amplifiers of the sensor column amplifier 42 to the output bound for the buffer amplifier 6.

Figure 16:
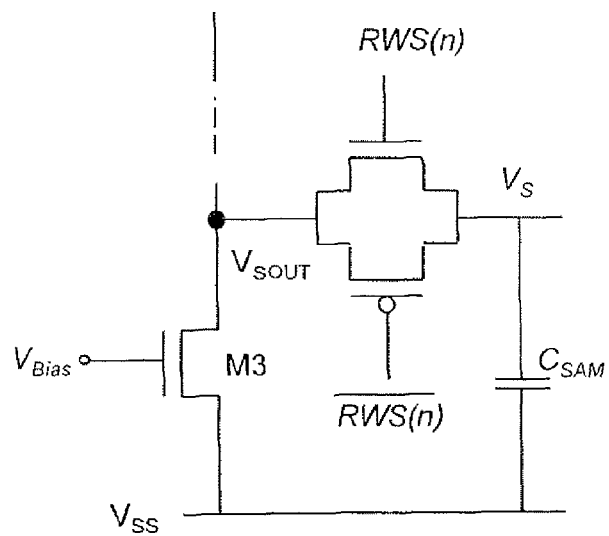
FIG. 16 is a circuit diagram showing an internal configuration of a sensor pixel readout circuit.
Figure 17:
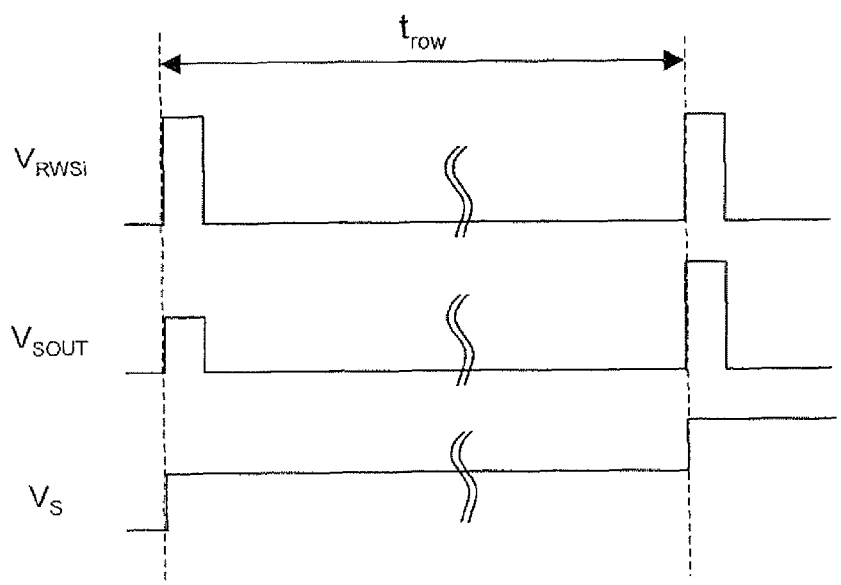
FIG. 17 is a waveform diagram showing a relationship between the readout signal, sensor output, and output of the sensor pixel readout circuit.

The following describes operations of the sensor column driver 4 and the buffer amplifier 6 that are performed after the sensor output $V_{SOUT}$ has been read out from the pixel region 1, with reference to FIGS. 16 and 17. FIG. 16 is a circuit diagram showing an internal configuration of the sensor pixel readout circuit 41. FIG. 17 is a waveform diagram showing a relationship between the readout signal $V_{RWS}$, the sensor output $V_{SOUT}$, and the output $V_S$ of the sensor pixel readout circuit. As previously described, when the readout signal has risen to the high level $V_{RWS,H}$, the transistor M2 becomes conductive, and therefore a source follower amplifier is formed by the transistors M2 and M3, and the sensor output $V_{SOUT}$ is accumulated in a sample capacitor $C_{SAM}$ of the sensor pixel readout circuit 41. Accordingly, even after the readout signal has fallen to the low level $V_{RWS,L}$, in the selection period of that row ($t_{row}$), the output voltage $V_S$ from the sensor pixel readout circuit 41 to the sensor column amplifier 42 is kept at the same level as the peak value of the sensor output $V_{SOUT}$, as shown in FIG. 17.

Figure 18:
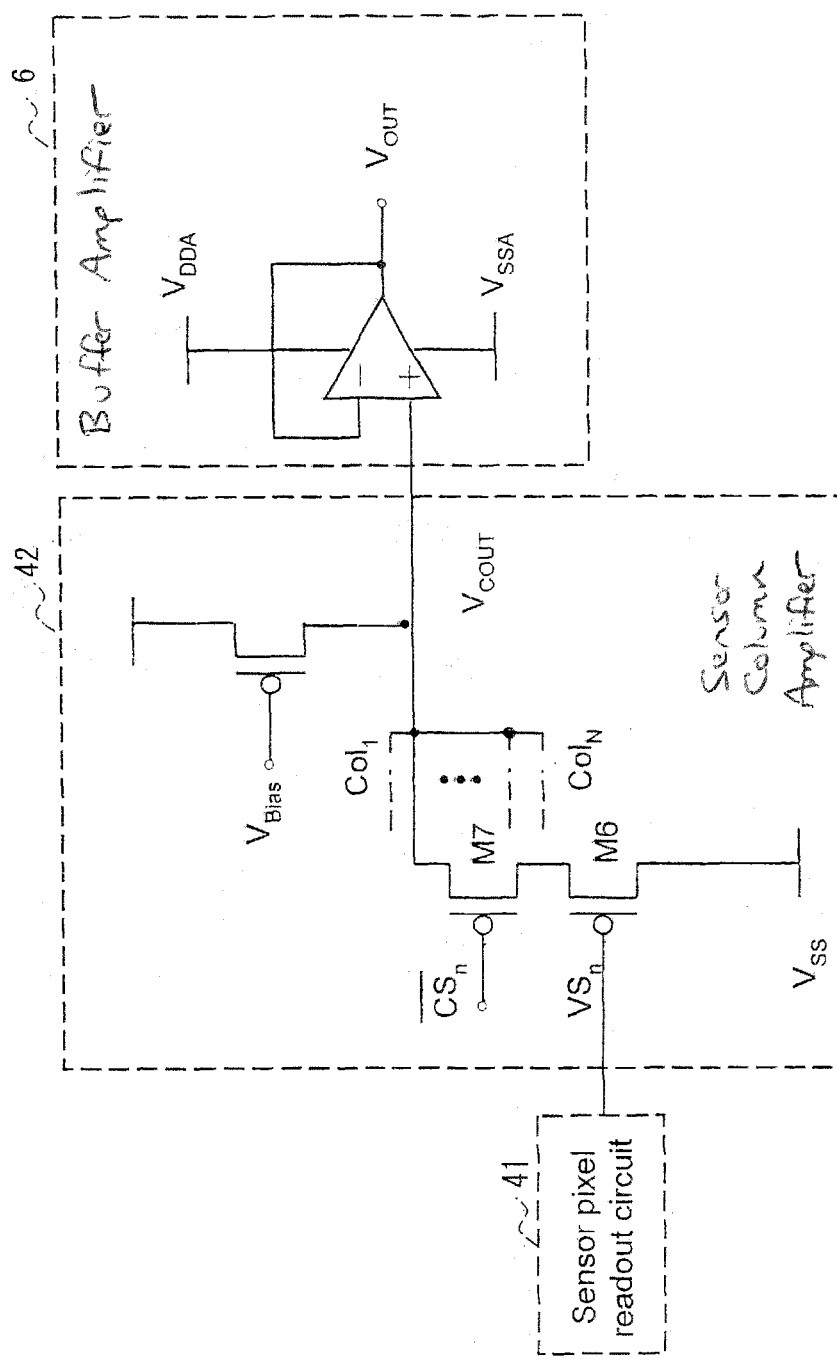
FIG. 18 is a circuit diagram showing an example of a configuration of a sensor column amplifier.

Next is a description of operations of the sensor column amplifier 42 with reference to FIG. 18. As shown in FIG. 18, the output voltages $V_{Sj}$ (j=1 to N) of the columns are output from the sensor pixel readout circuit 41 to the N number of column amplifiers of the sensor column amplifier 42. As shown in FIG. 18, each column amplifier is configured by transistors M6 and M7. The column select signals $CS_j$ generated by the sensor column scan circuit 43 successively become ON for each of the N columns in the select period of one row ($t_{row}$), and therefore the transistor M6 of only one of the N number of column amplifiers in the sensor column amplifier 42 is switched ON, and only any one of the output voltages $V_{Sj}$ (j=1 to N) of the columns is output as the output $V_{COUT}$ from the sensor column amplifier 42 via that transistor MG. The buffer amplifier 6 then amplifies the $V_{COUT}$ that has been output from the sensor column amplifier 42, and outputs the resulting amplified $V_{COUT}$ to the signal processing circuit 8 as panel output (a photosensor signal) $V_{out}$.

Note that although the sensor column scan circuit 43 may scan the photosensor columns one column at a time as described above, there is no limitation to this, and a configuration is possible in which the photosensor columns are interlace-scanned. Also, the sensor column scan circuit 43 may be formed as a multi-phase drive scan circuit that has, for example, four phases.

According to the above configuration, the display device according to the present embodiment obtains panel output $V_{OUT}$ that is in accordance with the amount of light received by the photodiode D1 formed in each pixel in the pixel region 1. The panel output $V_{OUT}$ is sent to the signal processing circuit 8, has A/D conversion performed thereon, and is accumulated in a memory (not shown) as panel output data. Specifically, the same number of panel output data pieces as the number of pixels (number of photosensors) in the pixel region 1 are accumulated in this memory. With use of the panel output data accumulated in the memory, the signal processing circuit 8 performs various types of signal processing such as image reading and the detection of a touch area. Note that although the same number of panel output data pieces as the number of pixels (number of photosensors) in the pixel region 1 are accumulated in the memory of the signal processing circuit 8 in the present embodiment, due to constraints such as memory capacity, there is no need to necessarily accumulate the same number of panel output data pieces as the number of pixels.

As described above, in the photosensor according to the present embodiment, the capacitance of the capacitor C1 can be made variable by changing the bias potential of the capacitor C1. This enables dynamically changing the size of the dynamic range of the photosensor.

Although an embodiment of the present invention has been described above, the present invention is not limited to only the above-described concrete example, and it is possible to make various changes within the scope of the invention.

Figure 19:
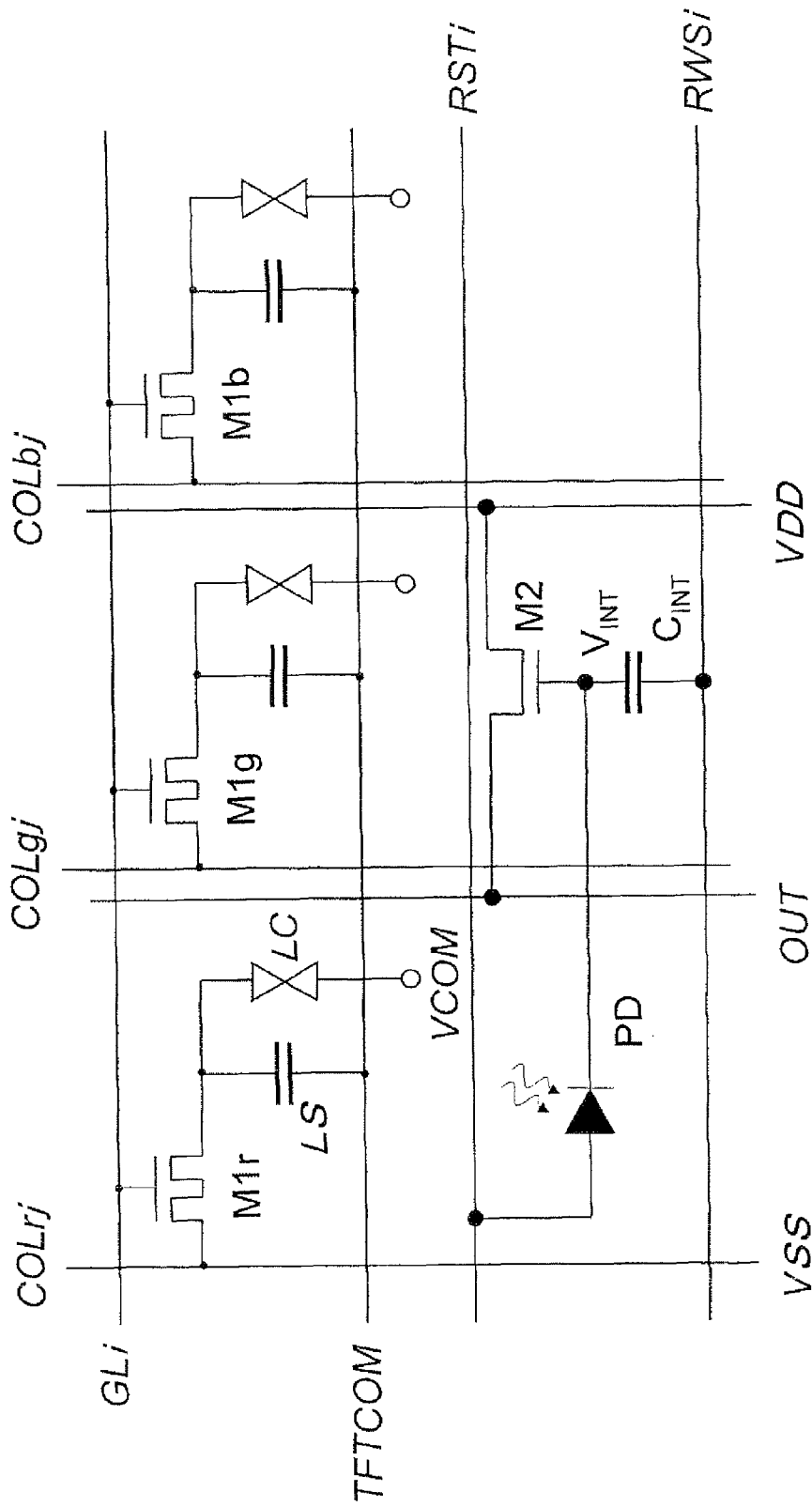
FIG. 19 is an equivalent circuit diagram showing a configuration in which bus line VDD and OUT of a photosensor are provided separately from source bus line COL, as a variation of a display device according to an embodiment of the present invention.

For example, the above embodiment describes an example of a configuration in which the bus line VDD and OUT that the photosensor is connected to are also used as the source bus line COL. This configuration has the advantage that the pixel aperture ratio is high. However, even in the case of a configuration in which, as shown in FIG. 19, the bus line VDD and OUT for the photosensor and the source bus line COL are provided separately, effects likewise to the those of the above embodiment can obtained.

Embodiment 2

The following describes another embodiment of the present invention with reference to the drawings. Note that the same reference numerals as those in Embodiment 1 have been used for constituent elements that have functions likewise to those of the constituent elements described in Embodiment 1, and detailed descriptions thereof have been omitted.

Figure 20:
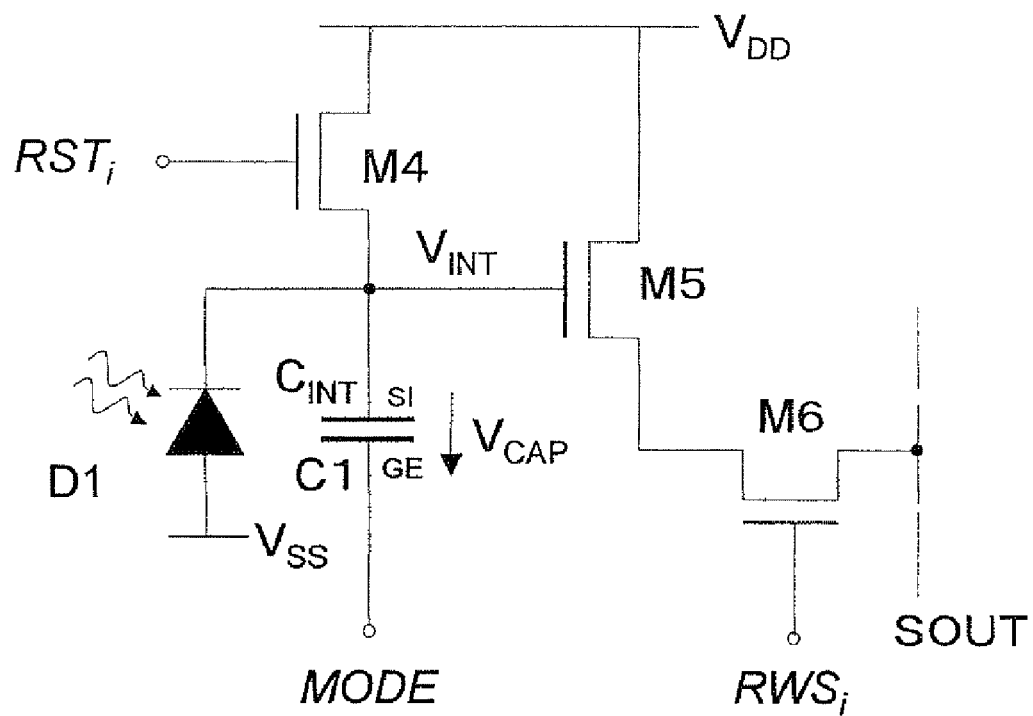
FIG. 20 is an equivalent circuit diagram showing a configuration of a pixel in a display device according to Embodiment 2 of the present invention.

Embodiment 2 differs from Embodiment 1 in that, whereas Embodiment 1 is a configuration in which one switching element is included in a photosensor, in Embodiment 2, three switching elements are included in a photosensor as shown in FIG. 20.

As shown in FIG. 20, the photosensor according to the present embodiment is configured by the photodiode D1 as the photodetection element, the capacitor C1, and transistors M4 to MG. The anode of the photodiode D1 is connected to the bus line VSS. The cathode of the photodiode D1 is connected to one electrode (the silicon layer 12) of the capacitor C1, the drain of the transistor M4, and the gate of the transistor M5. The source of the transistor M4 is connected to the bus line VDD, and the gate of the transistor M4 is connected to the bus line RST that supplies the reset signal. The other electrode (the GE metal 11) of the capacitor C1 is connected to bus line MODE, which supplies a mode signal for switching between the low capacitance mode and the high capacitance mode. The gate of the transistor MG is connected to the bus line RWS that supplies the readout signal. The source of the transistor MG is connected to the drain of the transistor M5, and the drain of the transistor MG is connected to the bus line SOUT for photosensor output. The bus line RST and RWS are connected to the sensor row driver 5.

In this configuration, in the case of switching to the low capacitance mode, the bus line MODE is connected to the bus line VDD in the integral period, and in the case of switching to the high capacitance mode, the bus line MODE is connected to the bus line VSS in the integral period. If the bus line MODE is connected to the bus line VDD, the bias potential $V_{CAP}$ of the capacitor C1 becomes greater than the threshold potential $V_T$, the capacitance of the capacitor C1 falls, and the dynamic range becomes wider. On the other hand, if the bus line MODE is connected to the bus line VSS, the bias potential VcAp of the capacitor C1 becomes less than the threshold potential $V_T$, the capacitance of the capacitor C1 rises, and the dynamic range becomes narrower.

As described above, according to Embodiment 2 as well, the capacitance of the capacitor C1 can be made variable by changing the bias potential of the capacitor C1, thus enabling dynamically changing the dynamic range of the photosensor.

INDUSTRIAL APPLICABILITY

The present invention is industrially applicable as a display device having a photosensor.

The invention claimed is:

1. A display device provided with an active matrix substrate, and comprising:
   a photosensor provided on the active matrix substrate;
   sensor driving bus line connected to the photosensor;
   a sensor driving circuit that supplies a sensor driving signal to the photosensor via the sensor driving bus line;
   an amplifier circuit that amplifies sensor output that has been read out from the photosensor in accordance with the sensor driving signal, and outputs the amplified sensor output as a photosensor signal; and
   a signal processing circuit that processes the photosensor signal that has been output from the amplifier circuit,
   wherein the photosensor includes a photodiode, a capacitor that is connected to the photodiode, the capacitor including a semiconductor junction or a Schottky junction, and at least one switching element,
   the sensor driving bus line includes at least reset signal bus line that supplies a reset signal to the photosensor, and readout signal bus line that supplies a readout signal to the capacitor,
   due to the sensor driving circuit switching ON the readout signal after a predetermined time has elapsed since switching ON the reset signal, a photosensor signal that is in accordance with an amount of light received by the photosensor in the predetermined time is output to the signal processing circuit, and
   wherein the sensor driving circuit is configured to vary the capacitance of the capacitor through changing the bias voltage across the capacitor between a bias potential higher than a threshold potential determined by the junction in the capacitor and a bias potential lower than the threshold potential.

2. The display device according to claim 1, wherein due to the sensor driving circuit changing the bias voltage of the capacitor, the capacitance of the capacitor is reduced in at least part of a period from when the reset signal is supplied until when the predetermined time has elapsed.

3. The display device according to claim 2,
   wherein the capacitor includes a metal layer and a silicon layer that has a semiconductor junction, and
   in at least part of the period from when the reset signal is supplied until when the predetermined time has elapsed, the sensor driving circuit causes the bias voltage of the capacitor to be equal to or smaller than a threshold voltage of the semiconductor junction.

4. The display device according to claim 2,
   wherein the capacitor includes a metal layer and a silicon layer that configures a Schottky junction between the metal layer and the silicon layer, and
   in at least part of the period from when the reset signal is supplied until when the predetermined time has elapsed, the sensor driving circuit causes the bias voltage of the capacitor to be equal to or smaller than a threshold voltage of the Schottky junction.

5. The display device according to claim 1,
   wherein the photosensor is provided in a pixel region of the active matrix substrate,
   the photosensor comprises one switching element,
   a cathode of the photodiode of the photosensor is connected to one electrode of the capacitor and the switching element, and an anode of the photodiode is connected to the reset signal bus line, and
   the readout signal bus line is connected to the other electrode of the capacitor.

6. The display device according to claim 5, wherein in part of the period from when the reset signal is supplied until when the predetermined time has elapsed, a low level potential of the readout signal is equal to or lower than a low level potential of the reset signal.

7. The display device according to claim 6, wherein a high level potential of the reset signal is higher than the low level potential of the reset signal outside the period, by only an amount that is $\Delta V_{RST} \cdot C_{PD}/C_T$ or is equal to the level of the low level potential of the reset signal outside the period plus the amount of $\Delta V_{RST} \cdot C_{PD}/C_T$ where $\Delta V_{RST}$ is the pulse height of the reset signal, $C_{PD}$ is the capacitance of the photodiode, and $C_T$ is the total capacitance of the connection point where the capacitor is connected to the photodiode.

8. The display device according to claim 6, wherein when the reset signal is switched ON, the potential of the readout signal is equal to or higher than the low level potential of the readout signal.

9. The display device according to claim 1, comprising a light shielding layer on a back face of the capacitor.

10. The display device according to claim 1,
wherein the photosensor is provided in a pixel region of the active matrix substrate,
the photosensor comprises a first switching element, a second switching element, and a third switching element,
a cathode of the photodiode of the photosensor is connected to one electrode of the capacitor, a drain of the first switching element, and a gate of the second switching element, and an anode of the photodiode is kept at a first reference potential,
a source of the first switching element and a source of the second switching element are kept at a second reference potential,
a drain of the second switching element is connected to a source of the third switching element,
a gate of the third switching element is connected to the readout signal bus line, and
the other electrode of the capacitor is connected to a supply line for a mode signal that switches a dynamic range of the photosensor.

11. The display device according to claim 10, wherein the supply line for the mode signal is connected to the second reference potential in at least part of the period from when the reset signal is supplied until when the predetermined time has elapsed, and outside the period, the supply line for the mode signal is connected to the first reference potential.

12. A display device provided with an active matrix substrate, and comprising:
a photosensor provided on the active matrix substrate;
sensor driving bus line connected to the photosensor;
a sensor driving circuit that supplies a sensor driving signal to the photosensor via the sensor driving bus line;
an amplifier circuit that amplifies sensor output that has been read out from the photosensor in accordance with the sensor driving signal, and outputs the amplified sensor output as a photosensor signal; and
a signal processing circuit that processes the photosensor signal that has been output from the amplifier circuit,
wherein the photosensor includes a photodiode, a capacitor that is connected to the photodiode, and at least one switching element,
the sensor driving bus line includes at least reset signal bus line that supplies a reset signal to the photosensor, and readout signal bus line that supplies a readout signal to the capacitor,
due to the sensor driving circuit switching ON the readout signal after a predetermined time has elapsed since switching ON the reset signal, a photosensor signal that is in accordance with an amount of light received by the photosensor in the predetermined time is output to the signal processing circuit,
and due to the sensor driving circuit changing the bias voltage of the capacitor, the capacitance of the capacitor is variable;
wherein the photosensor is provided in a pixel region of the active matrix substrate, the photosensor comprises one switching element, a cathode of the photodiode of the photosensor is connected to one electrode of the capacitor and the switching element, and an anode of the photodiode is connected to the reset signal bus line, the readout signal bus line is connected to the other electrode of the capacitor; wherein in part of the period from when the reset signal is supplied until when the predetermined time has elapsed, a low level potential of the readout signal is equal to or lower than a low level potential of the reset signal; and
wherein when the reset signal is switched ON, the potential of the readout signal is equal to or higher than the low level potential of the readout signal.

13. A display device provided with an active matrix substrate, and comprising:
a photosensor provided on the active matrix substrate;
sensor driving bus line connected to the photosensor;
a sensor driving circuit that supplies a sensor driving signal to the photosensor via the sensor driving bus line;
an amplifier circuit that amplifies sensor output that has been read out from the photosensor in accordance with the sensor driving signal, and outputs the amplified sensor output as a photosensor signal; and
a signal processing circuit that processes the photosensor signal that has been output from the amplifier circuit,
wherein the photosensor includes a photodiode, a capacitor that is connected to the photodiode, and at least one switching element,
the sensor driving bus line includes at least reset signal bus line that supplies a reset signal to the photosensor, and readout signal bus line that supplies a readout signal to the capacitor,
due to the sensor driving circuit switching ON the readout signal after a predetermined time has elapsed since switching ON the reset signal, a photosensor signal that is in accordance with an amount of light received by the photosensor in the predetermined time is output to the signal processing circuit,
and due to the sensor driving circuit changing the bias voltage of the capacitor, the capacitance of the capacitor is variable;
wherein the photosensor is provided in a pixel region of the active matrix substrate, wherein the photosensor comprises a first switching element, a second switching element, and a third switching element, a cathode of the photodiode of the photosensor is connected to one electrode of the capacitor, a drain of the first switching element, and a gate of the second switching element, and an anode of the photodiode is kept at a first reference potential,
a source of the first switching element and a source of the second switching element are kept at a second reference potential,
a drain of the second switching element is connected to a source of the third switching element,
a gate of the third switching element is connected to the readout signal bus line, and the other electrode of the capacitor is connected to a supply line for a mode signal that switches a dynamic range of the photosensor; and wherein the supply line for the mode signal is connected to the second reference potential in at least part of the period from when the reset signal is supplied until when the predetermined time has elapsed, and outside the period, the supply line for the mode signal is connected to the first reference potential.

* * * * *